(12) United States Patent
Guo et al.

(10) Patent No.: US 9,912,086 B2
(45) Date of Patent: Mar. 6, 2018

(54) ELECTRICAL CONNECTOR ASSEMBLY HAVING A SMALL-SIZED ELECTRICAL CONNECTOR

(71) Applicant: FOXCONN INTERCONNECT TECHNOLOGY LIMITED, Grand Cayman (KY)

(72) Inventors: Jing-Jie Guo, Huaian (CN); Cai-Yun Zhang, Huaian (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/295,984

(22) Filed: Oct. 17, 2016

(65) Prior Publication Data
US 2017/0110818 A1    Apr. 20, 2017

(30) Foreign Application Priority Data
Oct. 16, 2015   (CN) .......................... 2015 1 0667551

(51) Int. Cl.
*H01R 12/00*  (2006.01)
*H01R 12/71*  (2011.01)
(Continued)

(52) U.S. Cl.
CPC ......... *H01R 12/716* (2013.01); *H01R 12/721* (2013.01); *H01R 13/405* (2013.01);
(Continued)

(58) Field of Classification Search
CPC .................................................... H01R 12/716
(Continued)

(56) References Cited

U.S. PATENT DOCUMENTS 4,824,383 A * 4/1989 Lemke .................. H01R 24/60
439/108
6,257,482 B1 * 7/2001 Koshi .................. B23K 3/0653
228/260

(Continued)

FOREIGN PATENT DOCUMENTS

CN    203859282    * 10/2014 ............ H01R 13/46
CN    204179373 U    2/2015
(Continued)

*Primary Examiner* — Tulsidas C Patel
*Assistant Examiner* — Peter G Leigh
(74) *Attorney, Agent, or Firm* — Wei Te Chung; Ming Chieh Chang

(57) ABSTRACT

An electrical connector assembly includes an electrical connector, a printed circuit board, and an electrical device. The electrical connector includes an insulative housing defining a tongue portion, a number of first contacts and second contacts, and a shielding shell. The tongue portion has an exposed part exposed from a front edge of the shielding shell to receive in a mating hole of the electrical device. The electrical device has an installing portion assembling the electrical connector. The electrical connector is mated with a mating connector through the mating hole, the exposed part of the tongue portion is received in the mating hole of electrical device, and the electrical connector except the exposed part is exposed our of the installing portion of the electrical device.

19 Claims, 10 Drawing Sheets

(51) Int. Cl.
*H01R 13/405* (2006.01)
*H01R 13/652* (2006.01)
*H01R 24/60* (2011.01)
*H01R 12/72* (2011.01)
*H01R 13/6595* (2011.01)
*H01R 13/74* (2006.01)
*H05K 9/00* (2006.01)
*H01R 107/00* (2006.01)
*H01R 13/6586* (2011.01)

(52) U.S. Cl.
CPC ....... *H01R 13/652* (2013.01); *H01R 13/6595* (2013.01); *H01R 13/74* (2013.01); *H01R 24/60* (2013.01); *H05K 9/0018* (2013.01); *H01R 13/6586* (2013.01); *H01R 2107/00* (2013.01)

(58) Field of Classification Search
USPC .......................................................... 439/83
See application file for complete search history.

(56) References Cited

U.S. PATENT DOCUMENTS

| | | | | |
|---|---|---|---|---|
| 6,510,978 B1* | 1/2003 | Koshi | ................... | B23K 1/085 228/256 |
| 7,997,909 B2* | 8/2011 | Xu | ................... | H01R 13/6658 439/607.57 |
| 8,011,956 B1* | 9/2011 | Yang | ................. | H01R 13/5202 439/589 |
| 8,246,383 B2* | 8/2012 | Schmidt | ............... | H01R 13/405 439/587 |
| 8,506,327 B2* | 8/2013 | Jol | ..................... | B29C 45/1671 264/272.11 |
| 8,662,934 B2 | 3/2014 | Scritzky | | |
| 8,753,150 B2* | 6/2014 | Scritzky | ............... | H01R 13/405 439/108 |
| 8,894,445 B2* | 11/2014 | Jol | ......................... | H01R 24/62 439/108 |
| 8,925,195 B2* | 1/2015 | Schmidt | ............... | H01R 13/405 29/841 |
| 9,022,800 B2* | 5/2015 | Yang | .................. | H01R 13/6581 439/487 |
| 9,350,121 B2* | 5/2016 | Ju | ...................... | H01R 13/6585 |
| 9,444,177 B2 | 9/2016 | Tsai et al. | | |
| 9,614,333 B2* | 4/2017 | Tsai | ...................... | H01R 24/70 |
| 2011/0263142 A1* | 10/2011 | Huang | ............... | H01R 12/7029 439/83 |
| 2013/0260615 A1 | 10/2013 | Jol | | |
| 2015/0200504 A1* | 7/2015 | Little | .................... | H01R 24/60 439/345 |
| 2015/0207280 A1* | 7/2015 | Little | .................... | H01R 24/60 439/607.34 |
| 2015/0229077 A1* | 8/2015 | Little | ................... | H01R 12/724 439/78 |

FOREIGN PATENT DOCUMENTS

| | | | | |
|---|---|---|---|---|
| CN | 204289872 | * | 4/2015 | ............. H01R 13/52 |
| CN | 204289872 U | | 4/2015 | |
| CN | 204481257 U | | 7/2015 | |
| TW | M485547 | | 9/2014 | |

* cited by examiner

ELECTRICAL CONNECTOR ASSEMBLY HAVING A SMALL-SIZED ELECTRICAL CONNECTOR

BACKGROUND OF THE INVENTION

1. Field of the Invention

The present invention relates to an electrical connector, and more particularly to an electrical connector of a reduced size.

2. Description of Related Art

U.S. Pat. No. 8,753,150 discloses a receptacle connector. The receptacle connector includes an insulative housing, a number of contacts, and a shell attached to the housing. The insulative housing includes a main portion and a tongue portion extending upwardly from the main portion. The tongue portion is partly exposed from a front end of the shell. The metal shell is disposed longer than the tongue portion along a mating direction to lengthen the electrical connector along the mating direction and increase used area in electrical device.

Hence, an improved electrical connector is desired.

SUMMARY OF THE INVENTION

Accordingly, the object of the present invention is to provide an electrical connector assembly comprising: an electrical connector comprising an insulative housing defining a base portion and a tongue portion extending upwardly form the base portion, a plurality of first contacts and a plurality of second contacts disposed in the insulative housing, a shielding shell attached to the insulative housing, each first contact has a first contacting portion, each second contact has a second contacting portion, the first contacting portion and the second contacting portion respectively exposed from an upper surface and a bottom surface of the tongue portion, the tongue portion having a mating portion exposing the first contacting portion and the second contacting portion and an insulative portion connected with the mating portion and the base portion; a printed circuit board connected with the electrical connector; and an electrical device assembling the printed circuit board and the electrical connector, the electrical device having an installing portion assembling the electrical connector and a mating hole located at the installing portion; wherein the electrical connector is mated with a mating connector through the mating hole, the mating portion of the tongue portion is received in the mating hole of electrical device, the shielding shell is located behind a rear end of the mating hole, and a rear end of the mating portion is approximately abreast to the a front end of the shielding shell.

Other objects, advantages and novel features of the invention will become more apparent from the following detailed description when taken in conjunction with the accompanying drawings.

DETAILED DESCRIPTION OF THE PREFERRED EMBODIMENT

Figure 1:
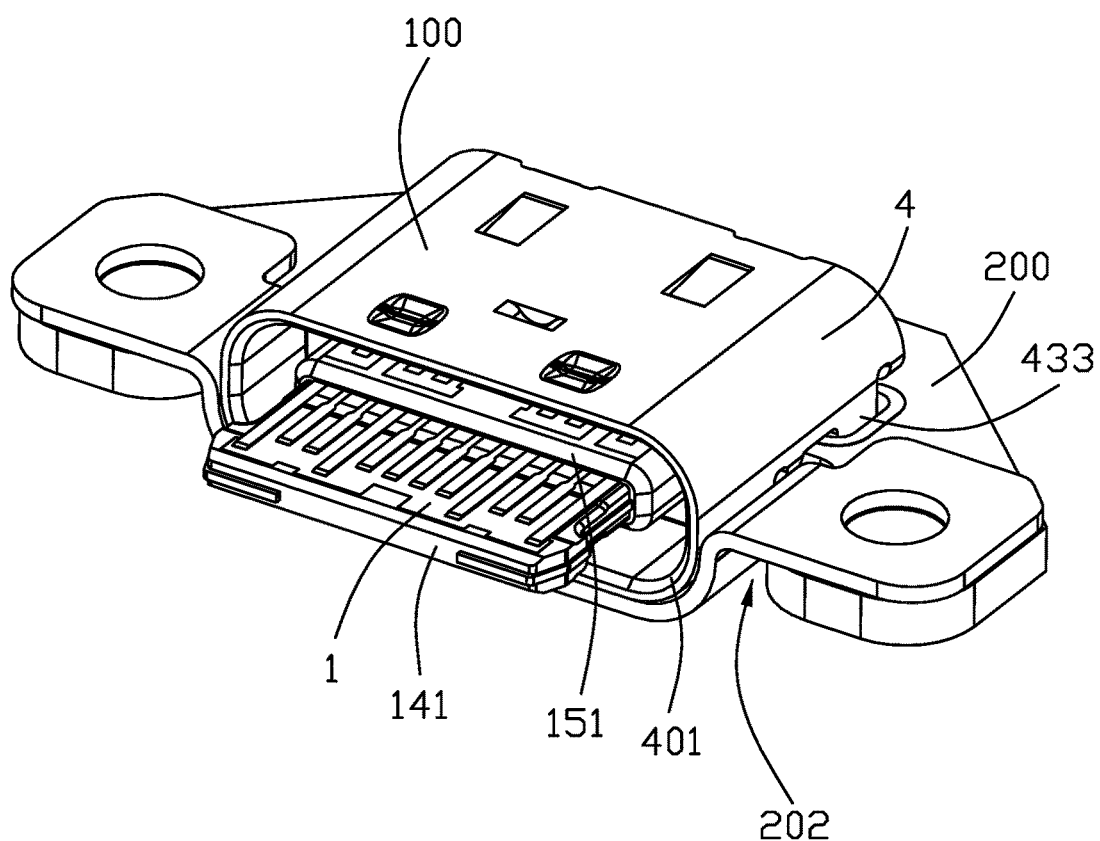
FIG. 1 is a perspective, assembled view of an electrical connector mounted upon a printed circuit board.

Reference will now be made in detail to the preferred embodiment of the present invention.

FIGS. 1-10 show an electrical connector assembly includes an electrical connector 100, a printed circuit board 200 connected with the electrical connector 100, and an electrical device 300 assembling the electrical connector 100 and the printed circuit board 200. For convenience, the electrical connector 100 defines a mating direction, a transverse direction perpendicular to the mating direction, and a vertical direction perpendicular to the mating direction and the transverse direction. The electrical connector 100 defines a mating port mated with a mating connector.

The electrical connector 100 includes an insulative housing 1, a number of terminals 2 and a metal sheet 3 retained in the insulative housing 1, a shielding shell 4 formed with a mating cavity to receive the insulative housing 1, and a metal shell/bracket 5 attached to the shielding shell 4.

Figure 5:
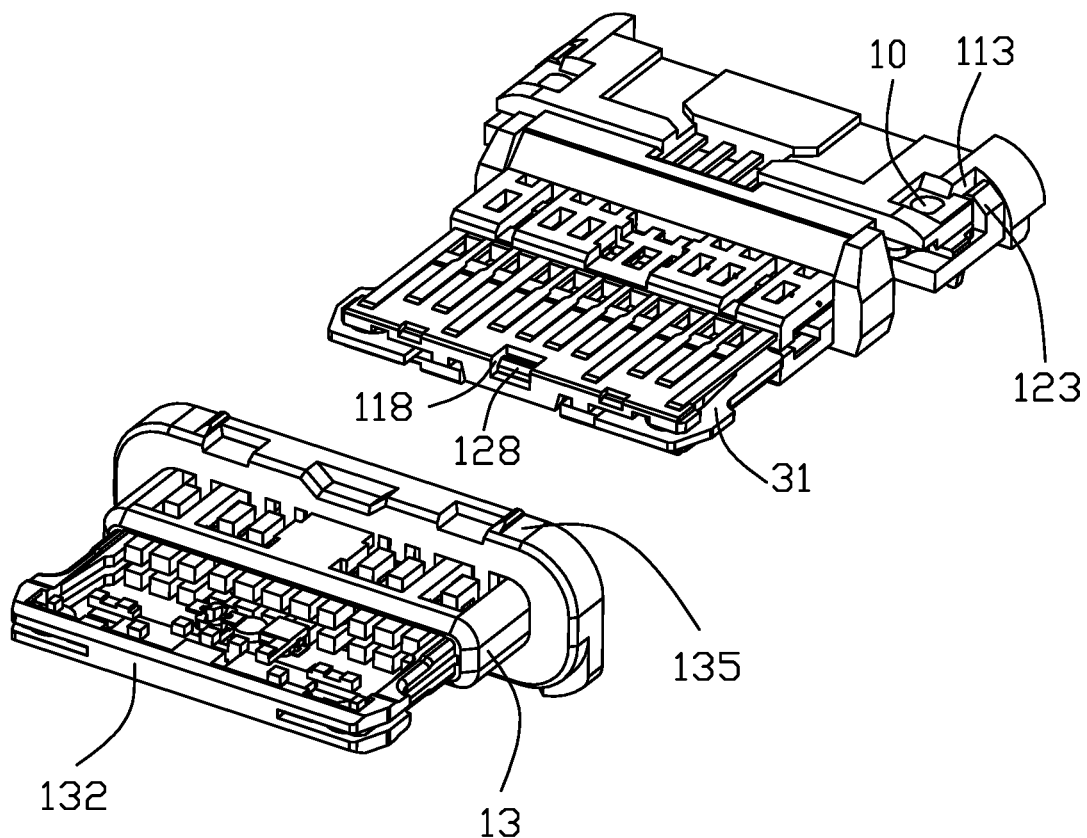
FIG. 5 is a perspective, exploded view of the electrical connector with no metal shell and no shielding shell and separated with the third insulative housing.
Figure 6:
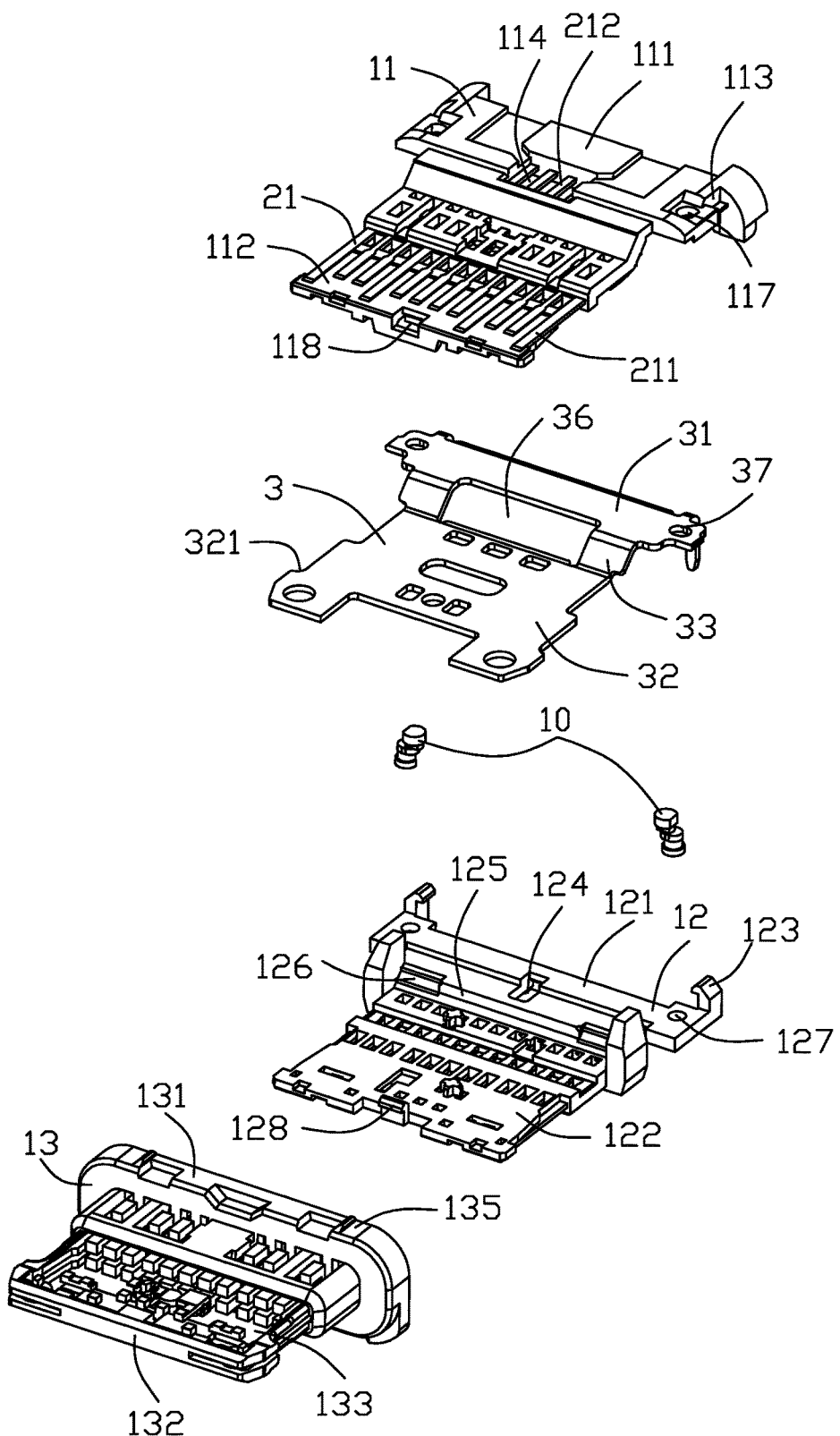
FIG. 6 is a further perspective, exploded view of FIG. 5.
Figure 7:
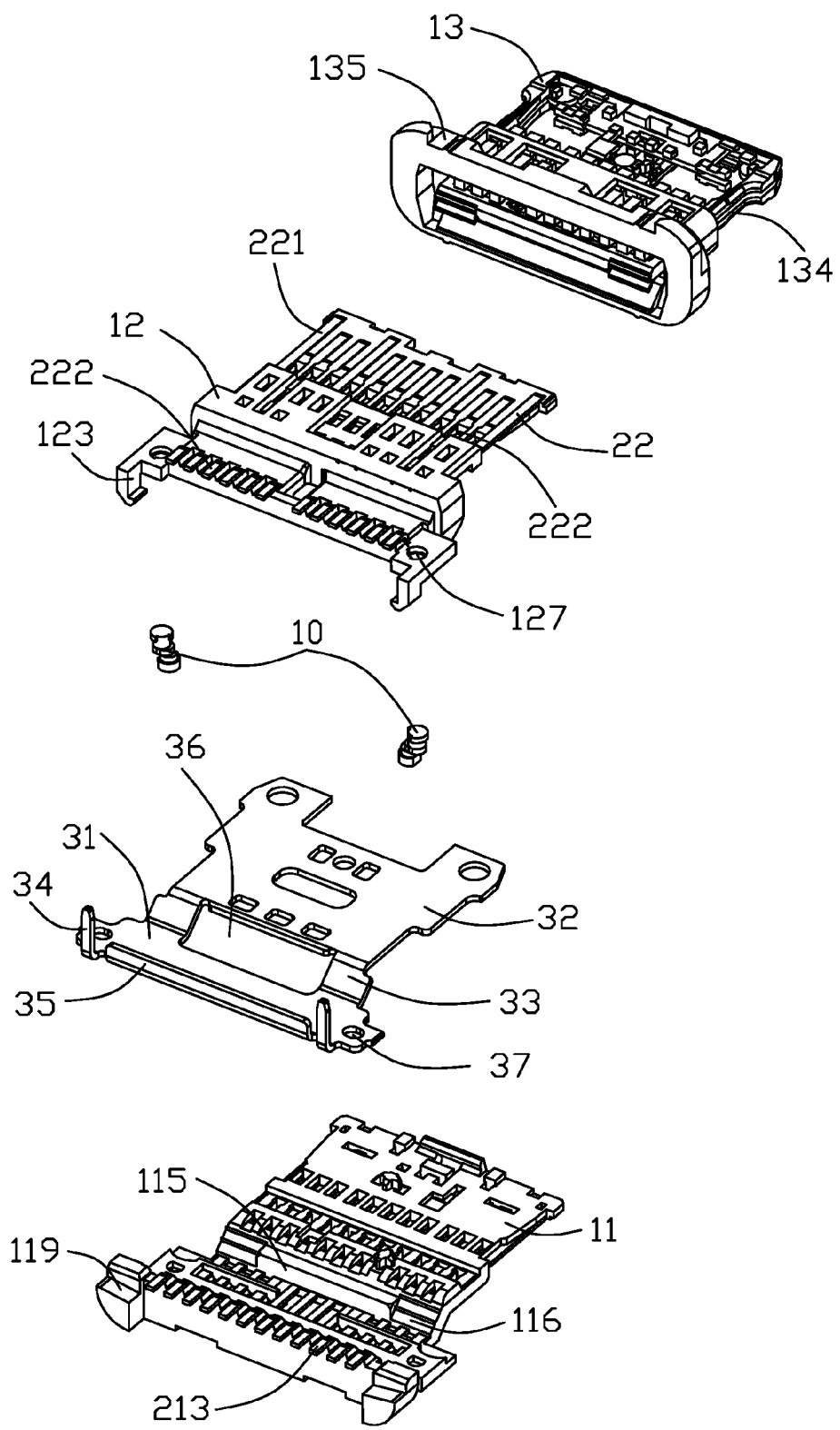
FIG. 7 is another perspective, exploded view of FIG. 6.

Referring to FIGS. 5-7, the insulative housing 1 includes a first insulative housing 11 and a second insulative housing 12 disposed in a vertical direction, and a third insulative housing 13 accommodating the first insulative housing 11 and the second insulative housing 12. The first insulative housing 11 includes a first base portion 111 and a first tongue portion 112 extending forwardly from the first base portion 111. The first base portion 111 defines a pair of gaps 113 located at a lower surface facing the second insulative housing 12 and a holding hole 114 located at a middle thereof. The first base portion 111 has a first stepping portion 115 close to the first tongue portion 112 and protruding to the second insulative housing 12 and a number of first ribs 116 located at two sides of the first stepping portion 115 and extending incline. The first base portion 111 has a pair of first affixed holes 117 located at two sides thereof and communicated an upper surface with a lower surface thereof. The first tongue portion 112 has an opening 118 located at a front end thereof. The first base portion 111 has a pair of depression 119 located at two sides of a rear end.

The second insulative housing 12 includes a second base portion 121 and a second tongue portion 122 extending forwardly from the second base portion 121. The second base portion 121 has a pair of projections 123 extending upwardly and locking the depression 113 of the first insulative housing 11, and a guiding hole 124 corresponding to the holding hole 114. The second base portion 121 has a second stepping portion 125 close to the second tongue portion 122 and protruding to the first insulative housing 11 and a number of second ribs 126 located at two sides of the second stepping portion 125 and extending incline. The first stepping portion 115 and the second stepping portion 125 are disposed in right angle shape to form a first plane and a second plane. The first plane is parallel to a horizontal plane to form a stepping surface. The stepping surface of the first stepping portion 115 is located at a lower surface and the stepping surface of the second stepping portion 125 is located at an upper surface. The second base portion 121 has a pair of second affixed holes 127 corresponding to the first affixed holes 117. The second tongue portion 122 has a bulge 128 protruding upwardly to the opening 118.

The third insulative housing 13 including a third base portion 131 and a third tongue portion 132 extending forwardly from the third base portion 131. The third tongue portion 132 defines a hollow part 133 and a pair of affixed parts 134 in two sides thereof. The third base portion 131 defines a number of guiding grooves 135 located at an upper surface and a lower surface. The first tongue portion 112, the second tongue portion 122, and the third tongue portion 132 are defined as a tongue portion. The first base portion 111, the second base portion 121, and the third base portion 131 are defined as a base portion.

Referring to FIGS. 1-7, the terminals 2 includes a number of first contacts 21 carried by the first tongue portion 112 and a number of second contacts 22 carried by the second tongue portion 122. The first contacts 21 and the second contacts 22 extending in an insertion direction respectively includes four power contacts located forwardly and eight signal contacts located backwardly. The two power contacts in the middle are used to provide electric source and the other two are used for electrical grounding. The eight signal contacts includes four super-speed differential contacts located at two sides, two low-speed differential contacts located in the middle, and a pair of controlling contacts. Each of the first contacts 21 is associated with a respective one of the second contacts 22 and is positioned in reverse symmetry with respect to the second contacts 22.

Each of the first contacts 21 includes a first contacting portion 211 disposed in an upper surface of the first tongue portion 112, a first connecting portion 212 extending incline, and a first soldering portion 213 extending from a back end of the first base portion 111. Each of the second contacts 22 includes a second contacting portion 221 disposed in a bottom surface of the second tongue portion 122, a second connecting portion 222 extending incline, and a second soldering portion 223 extending from a back end of the second base portion 121. The first contacts 21 and the second contacts 22 are positioned to have 180 degree symmetry such that the corresponding plug connector can be inserted and operatively coupled to the electrical connector 100 in either of two orientations. The first soldering portion 213 and the second soldering portion 223 are located at a same plane and configured in two rows.

The metal sheet 3 includes a first supporting portion 31 sandwiched between the first base portion 111 of the first insulative housing 11 and the second base portion 121 of the second insulative housing 12, a second supporting portion 32 sandwiched between the first tongue portion 112 of the first insulative housing 11 and the second tongue portion 122 of the second insulative housing 12, a connection 33 connected the first supporting portion 31 and the second supporting portion 32 and extending incline, a pair of soldering legs 34 extending downwardly from a rear end of the first supporting portion 31, and a rear wall 35 extending downwardly from a rear end of the first supporting portion 31 and between the pair of soldering legs 34. The connection 33 has an aperture 36 to contact the first stepping portion 115 and the second stepping portion 125 therethrough to contact the stepping surfaces of the first stepping portion 115 and the second stepping portion 125. The first supporting portion 31 has a pair of third affixed holes 37 corresponding to the first affixed holes 117 and the second affixed holes 127. The electrical connector 100 further has a pair of blocks 10 extending through the first affixed holes 117, the second affixed holes 127, and the third affixed holes 37 to enhance the stability of the first insulative housing 11, the second insulative housing 12, and the third insulative housing 13.

The shielding shell 4 includes a top wall 41 and a bottom wall 42 located oppositely, and a pair of side walls 43 connected with the top wall 41 and the bottom wall 42. The bottom wall 42 is shorter than the top wall 41 along the mating direction. The top wall 41 has a number of springs 411 engaged with the guiding grooves 135. The side walls 43 have a pair of first affixed legs 431 located at a rear end, a pair of second affixed legs 432 close to the bottom wall 42, and a third affixed legs 433 extending downwardly and between the first affixed legs 431 and the second affixed legs 432. The first affixed legs 431 is received in the depressions 119 of the insulative housing 1 and the second affixed legs 432 are engaged with a rear end of the third insulative housing 13.

Figure 2:
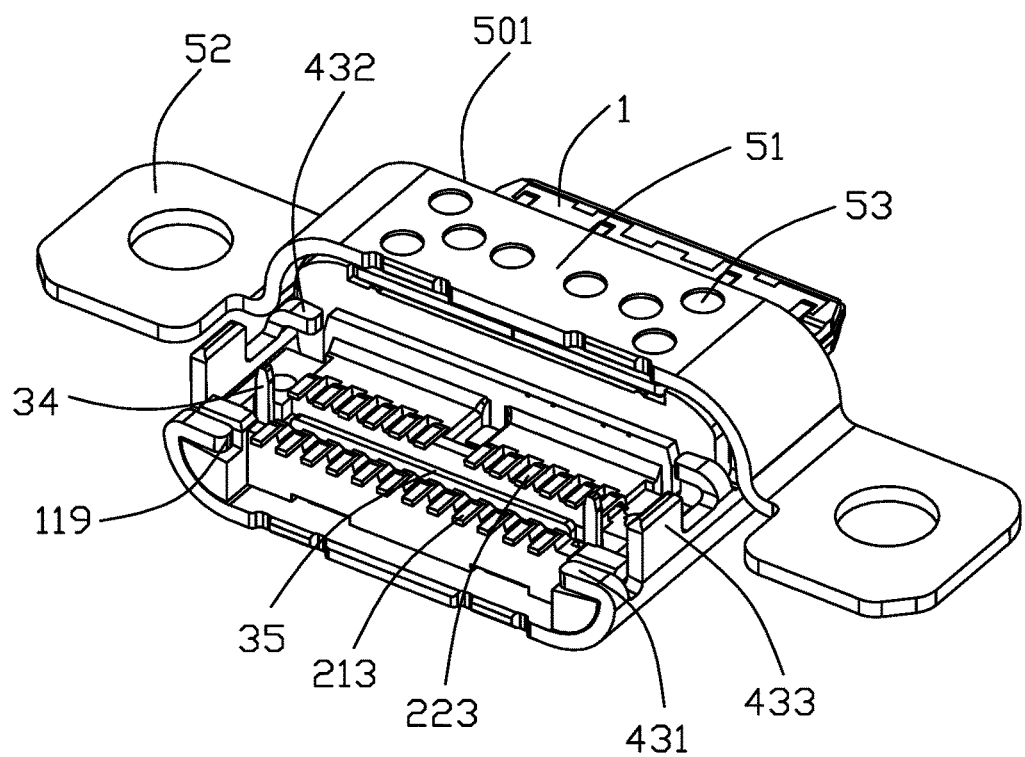
FIG. 2 is a another perspective, assembled view of FIG. 1.

The metal shell 5 includes a main portion 51 and a pair of side portions 52 extending laterally from two sides of the main portion 51. The side portions 52 have a pair of locating holes 50. Referring to FIG. 2, the metal shell 5 is soldered to the bottom wall 42 of the shielding shell 4 to form eight soldering spots 53, and the main portion 51 is as wide as the bottom wall 42. The eight soldering spots 53 are disposed in centro-symmetry, four of the eight spots 53 are located in a line along a transverse direction, and other four are located in two groups along a mating direction. The eight soldering spots are divided into two groups and the two groups are located in T shape to attain enough force in a smaller contacting surface of the main portion 51 of the metal shell 5 and the bottom wall 42 of the shielding shell 4, thus powerful soldering intensity is attained in condition of unchanging the length of the electrical connector 100 along the mating direction.

Referring to FIGS. 1-2, the electrical connector 100 is connected to the printed circuit board 200 via the first soldering portion 213, the second soldering portion 223, and the third affixed portion 433 affixed to printed circuit board 200. The printed circuit board 200 has a number of receiving holes 201 corresponding to the locating holes 50 of the metal shell 5.

Figure 3:
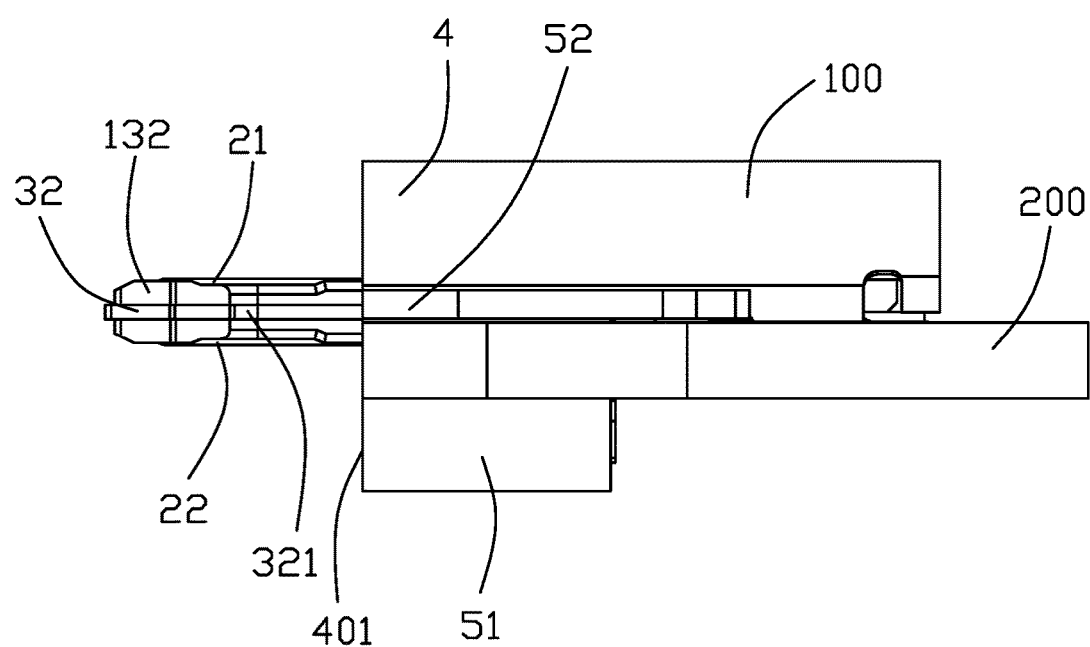
FIG. 3 is side view of the electrical connector mounted upon a printed circuit board.
Figure 4:
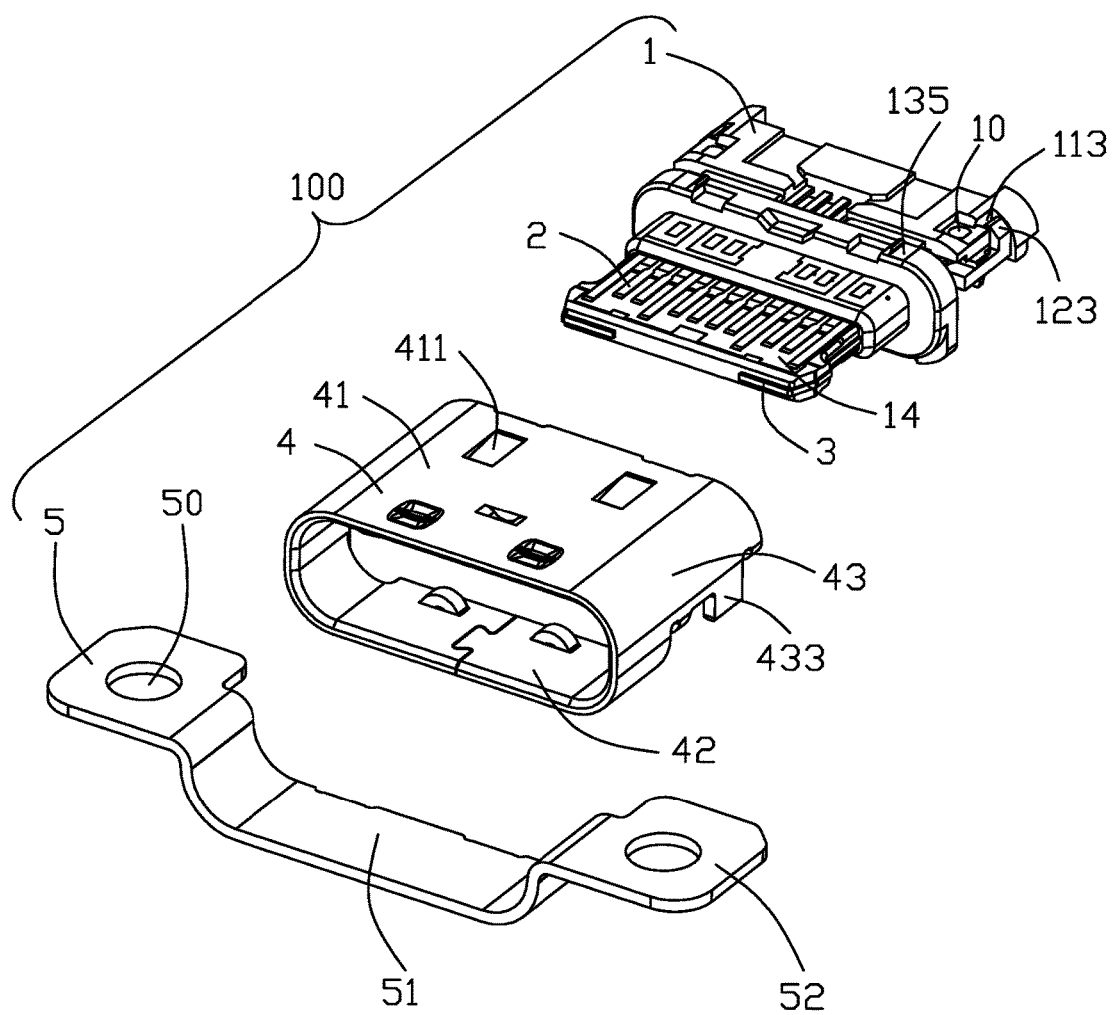
FIG. 4 is a perspective view of the electrical connector with no metal shell and no shielding shell.
Figure 10:
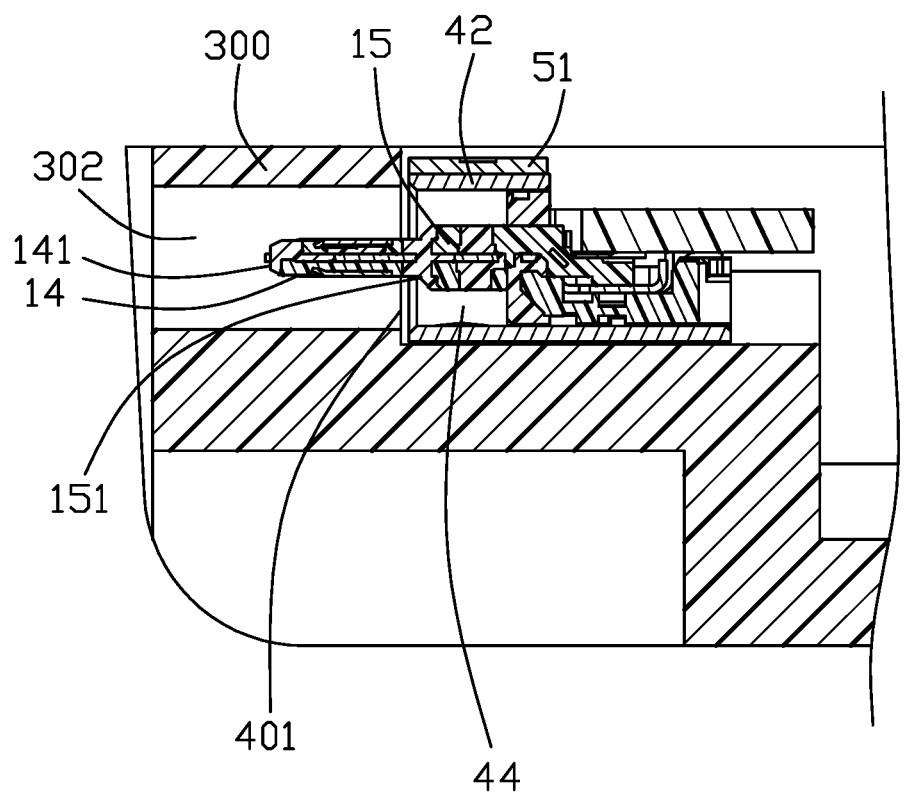
FIG. 10 is a cross-sectional view of FIG. 8.

Referring to FIG. 3, a rear end of the shielding shell 4 is abreast to a rear end of the metal shell 5, a front end of the shielding shell 4 is abreast to a front end of the metal shell 5, and the tongue portion is at least partly exposed from the front end of the shielding shell 4 and the metal shell 5 to shorten length of the electrical connector 100 along the mating direction. Referring to FIG. 10, the tongue portion includes a mating portion 14 exposing the first contacting portion 211 and the second contacting portion 221 and an insulative portion 15 connected with the mating portion 14 and the base portion. The insulative portion 15 is thicker than the mating portion 14 and forms a stepping shape therewith. The shielding shell 4 defines a front edge 401, the mating portion 14 defines a front edge 141, the insulative portion (or step portion) 15 defines a front edge 151. It's clearly shown in FIG. 10 and FIG. 1, the front edge 401 of the metallic shell 4 is wholly located behind corresponding front edge 141 of the mating portion and in front of corresponding front edge 151 of the insulative portion (or step portion) 15. The metal sheet 4 defines a pair of side latches 321 as best shown in FIG. 5. Combined with FIG. 3, the front edge 401 of the shell is located behind the side latch 321 of the metal sheet 3.

Figure 8:
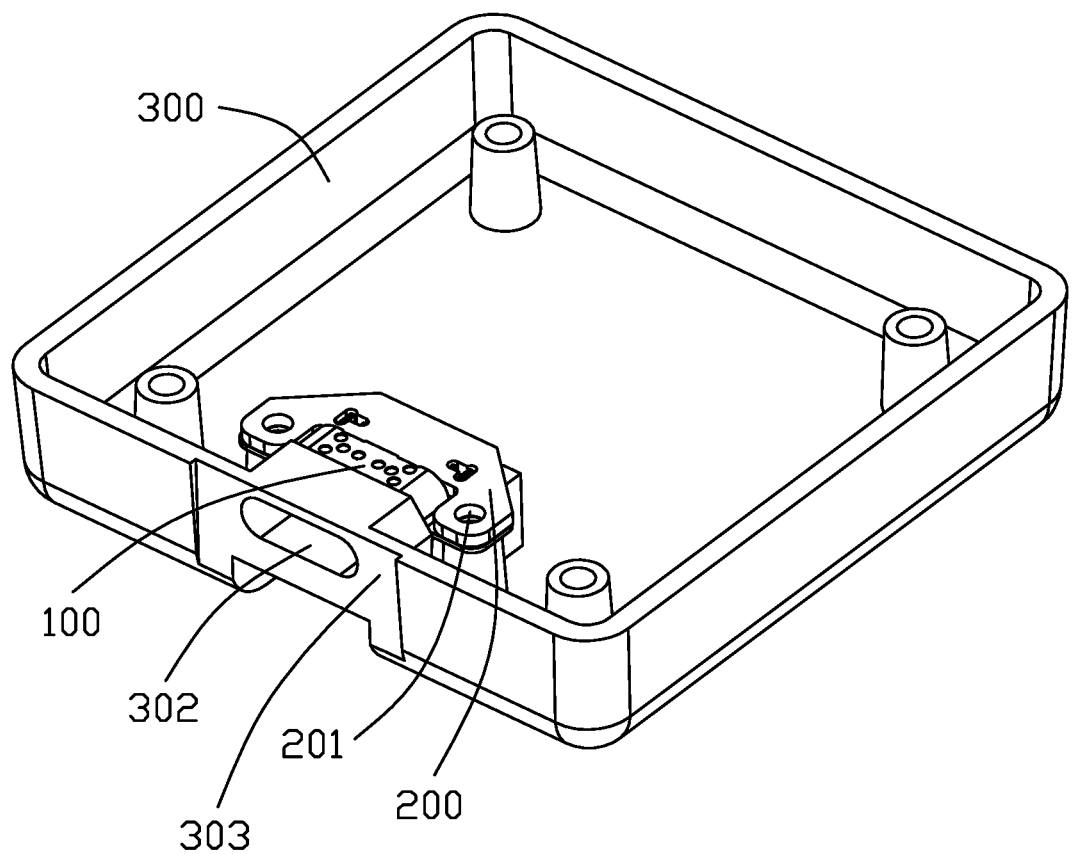
FIG. 8 is a perspective, assembled view of an electrical connector assembly.
Figure 9:
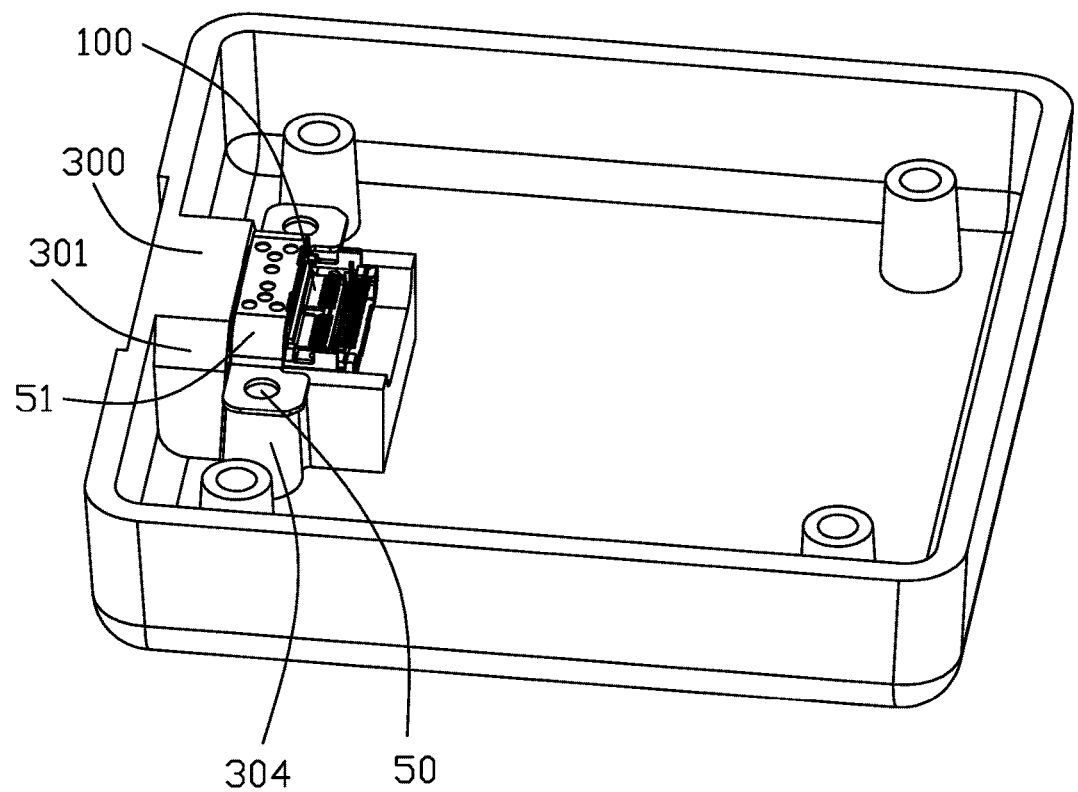
FIG. 9 is another view of the electrical connector assembly with no printed circuit board.

Referring to FIGS. 8-9, the electrical connector 100 affixed to the printed circuit board 200 is assembled to a pair of posts of the electrical device 300 via screws affixed to the posts through the locating holes 50 and the receiving holes 201. The electrical device 300 has an installing portion 301 cooperated with the electrical connector 100 and a mating hole 302 located at the installing portion 301 and contacting with the mating connector therethrough. The mating portion 14 is received in the mating hole 302 to be protected by a shell of the electrical device 300. Referring to FIG. 9, front ends of the shielding shell 4 and the metal shell 5 are located behind a rear end of the installing portion 301 of the electrical device 300, in other word, the shielding shell 4 and the metal shell 5 are located outside the mating hole 302 to shorten length of the electrical connector 100 along the mating direction to decrease area used therein to be convenient for assembly of other components and good for small size and thinness. Notably, in the invention the complementary plug connector (not shown) is received within both the mating hole 302 and the mating cavity 44 formed between the shielding shell 4 and the insulative portion 15, referring to FIG. 10.

However, the disclosure is illustrative only, changes may be made in detail, especially in matter of shape, size, and arrangement of parts within the principles of the invention.

What is claimed is:

1. An electrical connector assembly comprising:
an electrical device including an insulative case defining a mating hole along a front-to-back direction;
an electrical connector disposed in the electrical device behind the capsular mating hole in said front-to-back direction, said electrical connector including:
an insulative housing including a rear base portion and a front tongue portion along said front-to-back direction, said front tongue portion further defining a front mating portion and a rear insulative portion along said front-to-back direction;
a plurality of contacts disposed in the insulative housing with corresponding contacting portions exposed upon two opposite surfaces of the front mating portion;
a shielding shell enclosing said rear insulative portion while said mating portion being exposed forwardly beyond said shielding shell and extending into the mating hole; wherein
the mating hole and a mating cavity formed between the rear insulative portion and the shielding shell are adapted for commonly compliantly receiving a complementary plug connector.

2. The electrical connector assembly as claimed in claim 1, wherein a dimension of the mating cavity is smaller than a dimension of said mating hole.

3. The electrical connector assembly as claimed in claim 2, wherein a tapered structure is formed around a front edge of the shielding shell for guiding the complementary plug connector from the mating hole into the mating cavity.

4. The electrical connector assembly as claimed in claim 2, wherein a step structure is formed in the insulative case around an interface between the mating hole and the mating cavity for receiving the shielding shell.

5. The electrical connector assembly as claimed in claim 1, wherein said rear insulative portion is thicker than the mating portion so as to form a stepped structure compared with the mating portion.

6. The electrical connector assembly as claimed in claim 1, further including a metal bracket attached to the shielding shell, wherein said metal bracket defines a front edge located behind the mating hole in said front-to-back direction.

7. The electrical connector assembly as claimed in claim 6, further including a printed circuit board having a notch in which the electrical connector is received, and having a surface on which the metal bracket and the tails of the contacts are mounted.

8. The electrical connector assembly as claimed in claim 7, wherein the metal bracket has a pair of lateral side portions, and said electrical device includes a post structure cooperating with the printed circuit board to sandwich the side portions of said metal bracket therebetween in a vertical direction perpendicular to said front-to-back direction.

9. The electrical connector assembly as claimed in claim 7, wherein a hole extends through said printed circuit board, said metal bracket and said post structure in a vertical direction perpendicular to said front-to-back direction.

10. The electrical connector assembly as claimed in claim 7, wherein the shielding shell has affixed legs located behind the notch and extending through the printed circuit board in a vertical direction perpendicular to said front-to-back direction.

11. The electrical connector assembly as claimed in claim 1, wherein said electrical connector is formed by a pair of terminal modules each formed via a first stage insert molding process, commonly sandwiching a metallic shielding plate therebetween in a vertical direction perpendicular to said front-to-back direction to form a final configuration via a second stage insert molding process.

12. The electrical connector assembly as claimed in claim 1, wherein said shielding shell is fully located behind the mating hole in the front-to-back direction.

13. An electrical connector comprising:
an insulative housing including a base portion and a tongue portion extending from the base portion along a front-to-back direction, the tongue portion further defining a mating portion and an insulative portion connecting with the mating portion and the base portion, the insulative portion being thicker than the mating portion in a vertical direction perpendicular to said front-to-back direction, so as to form a step shape therewith;
a plurality of contacts disposed in the insulative housing with corresponding contacting portions exposed upon two opposite surfaces of the mating portion and located in front of the insulative portion;
a shielding shell retained around the base portion and surrounding the tongue portion thereby defining a mating cavity between the tongue portion and the shielding shell; wherein
each of the shielding shell, the mating portion and the insulative portion defines a front edge of the shielding shell is located wholly behind the front edge of the mating portion while in front of the front edge of the insulative portion in the front-to-back direction.

14. The electrical connector as claimed in claim 13, wherein the electrical connector comprises a metal sheet retained in the insulative housing and embedded between said two opposite surfaces of the mating portion in the vertical direction, and the metal sheet defines a pair of side latches exposed upon opposite lateral sides of the mating portion.

15. The electrical connector as claimed in claim 14, wherein the metal sheet includes a first supporting portion, a second supporting portion and a connection portion connecting the first and second supporting portions, the connection portion extends in an inclined manner.

16. The electrical connector as claimed in claim 13, wherein viewed in the vertical direction, the front edge of the shielding shell is closer to the front edge of the insulative portion than to the front edge of the mating portion in the front-to-back direction.

17. An electrical connector comprising:
a housing including a base portion and a tongue portion extending from the base portion along a front-to-back direction, the tongue portion further defining a mating portion and a step portion connecting between the mating portion and the base portion, the step portion being thicker than the mating portion in a vertical direction perpendicular to the front-to-back direction;
a row of first contacts and a row of second contacts comprising front contacting portions exposed upon two opposite surfaces of the mating portion, and rear solder portions;
a metal sheet retained in the housing and defining a pair of side latches;
a shielding shell retained around the base portion and partially surrounding the tongue portion thereby defining a mating cavity between the tongue portion and the shielding shell; wherein
each of the shielding shell, the mating portion and the step portion defines a front edge; wherein
the front edge of the shielding shell is located wholly behind the front edge of the mating portion and the pair of side latches while in front of the front edge of the step portion.

18. The electrical connector as claimed in claim 17, wherein viewed in the vertical direction, the front edge of the shielding shell is closer to the front edge of the step portion than to the front edge of the mating portion in the front-to-back direction.

19. The electrical connector as claimed in claim 17, further including a printed circuit board having a notch in which the electrical connector is received, and having a surface on which soldering portions of the contacts are mounted, and the shielding shell has affixed legs located behind the notch and extending through the printed circuit board in said vertical direction.

* * * * *

UNITED STATES PATENT AND TRADEMARK OFFICE
CERTIFICATE OF CORRECTION

PATENT NO.         : 9,912,086 B2
APPLICATION NO.    : 15/295984
DATED              : March 6, 2018
INVENTOR(S)        : Jing-Jie Guo and Cai-Yun Zhang Page 1 of 1

It is certified that error appears in the above-identified patent and that said Letters Patent is hereby corrected as shown below:

In the Claims

On Column 6, Line 50, of Claim 13, after "edge", please insert --; wherein the front edge--.

Signed and Sealed this
Sixteenth Day of April, 2019

Andrei Iancu
*Director of the United States Patent and Trademark Office*